(12) United States Patent
Komatsu et al.

(10) Patent No.: US 8,334,481 B2
(45) Date of Patent: Dec. 18, 2012

(54) MOUNTING TABLE STRUCTURE, AND PROCESSING APPARATUS

(75) Inventors: Tomohito Komatsu, Nirasaki (JP); Hirohiko Yamamoto, Nirasaki (JP); Daisuke Toriya, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 355 days.

(21) Appl. No.: 12/505,282

(22) Filed: Jul. 17, 2009

(65) Prior Publication Data

US 2009/0277895 A1  Nov. 12, 2009

Related U.S. Application Data

(63) Continuation of application No. PCT/JP2008/050443, filed on Jan. 16, 2008.

(30) Foreign Application Priority Data

Jan. 17, 2007 (JP) ................................ 2007-008105
Sep. 26, 2007 (JP) ................................ 2007-250195

(51) Int. Cl.
*F27B 5/14* (2006.01)
*F27D 11/02* (2006.01)
*H05B 3/03* (2006.01)
*H05B 3/08* (2006.01)

(52) U.S. Cl. ..................... 219/390; 219/444.1; 219/541; 118/728

(58) Field of Classification Search ........................ None
See application file for complete search history.

(56) References Cited

U.S. PATENT DOCUMENTS

| 5,511,799 | A | * | 4/1996 | Davenport et al. | ........... 277/637 |
| 5,625,526 | A | | 4/1997 | Watanabe et al. | |
| 6,120,661 | A | * | 9/2000 | Hirano et al. | ............ 204/298.15 |
| 6,397,581 | B1 | * | 6/2002 | Vidal et al. | .................. 165/134.1 |
| 6,488,820 | B1 | * | 12/2002 | Burkhart | .................... 204/192.1 |
| 6,617,514 | B1 | | 9/2003 | Ushikoshi et al. | |
| 7,000,823 | B2 | * | 2/2006 | Dockus et al. | ........... 228/262.51 |
| 7,361,230 | B2 | * | 4/2008 | Natsuhara et al. | ............ 118/728 |
| 7,564,008 | B2 | * | 7/2009 | Mori et al. | ................. 219/444.1 |
| 8,193,629 | B2 | * | 6/2012 | Takebayashi et al. | ........ 257/690 |

(Continued)

FOREIGN PATENT DOCUMENTS

EP  1 300 871 A2  4/2003

(Continued)

*Primary Examiner* — Joseph M Pelham
(74) *Attorney, Agent, or Firm* — Oblon, Spivak, McClelland, Maier & Neustadt, L.L.P.

(57) ABSTRACT

A mounting table body made of ceramic includes power-receiving conductor portions and buried therein. A surface of mounting table body is formed with a recessed connection hole and a connection terminal electrically jointed to the power-receiving conductor portion and exposed into the connection hole, the connection terminal being made of a high-melting-point metal, an alloy thereof or a compound thereof. A power-feeding line member provided with a power-feeding connector portion is inserted at its leading end portion into the connection hole to feed electricity to the power-receiving conductor portion. A stress relaxing member is interposed between the connection terminal and the power-feeding connector portion. The stress relaxing member and the connection terminal are jointed together by a brazing material. The stress relaxing member is made of a metal free from cobalt and nickel or an alloy thereof.

7 Claims, 12 Drawing Sheets

U.S. PATENT DOCUMENTS

| | | | |
|---|---|---|---|
| 2001/0042744 A1* | 11/2001 | Tachikawa et al. | 219/444.1 |
| 2002/0185487 A1* | 12/2002 | Divakar et al. | 219/444.1 |
| 2003/0029572 A1* | 2/2003 | Kanno et al. | 156/345.53 |
| 2003/0066608 A1* | 4/2003 | Natsuhara et al. | 156/345.43 |
| 2003/0189082 A1* | 10/2003 | Dockus et al. | 228/56.3 |
| 2004/0146737 A1 | 7/2004 | Fujii et al. | |
| 2005/0016986 A1* | 1/2005 | Ito | 219/444.1 |
| 2006/0073349 A1 | 4/2006 | Aihara et al. | |
| 2006/0096972 A1* | 5/2006 | Nakamura | 219/444.1 |
| 2006/0169688 A1* | 8/2006 | Mori et al. | 219/444.1 |
| 2008/0190364 A1* | 8/2008 | Mahon et al. | 118/500 |

FOREIGN PATENT DOCUMENTS

| | | |
|---|---|---|
| JP | 63-278322 | 11/1988 |
| JP | 6-260430 | 9/1994 |
| JP | 7-74234 | 3/1995 |
| JP | 7-78766 | 3/1995 |
| JP | 10-209255 | 8/1998 |
| JP | 11-12053 | 1/1999 |
| JP | 2004-253786 | 9/2004 |
| JP | 2004-356624 | 12/2004 |
| JP | 2006-128603 | 5/2006 |
| JP | 2006-186351 | 7/2006 |

* cited by examiner

FIG. 4
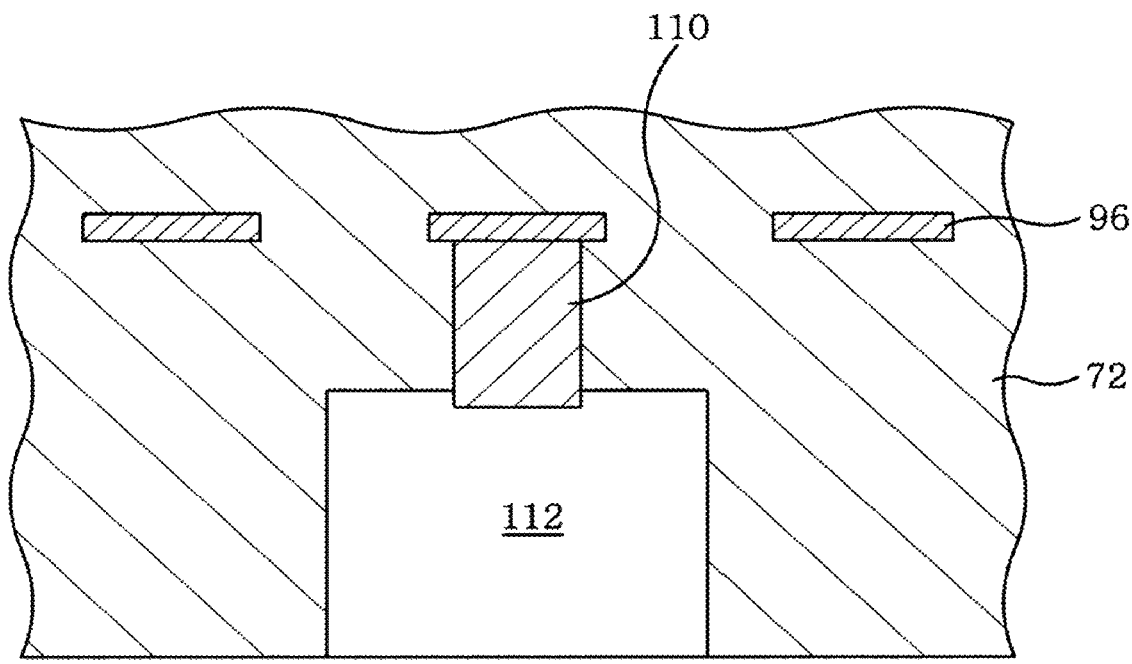
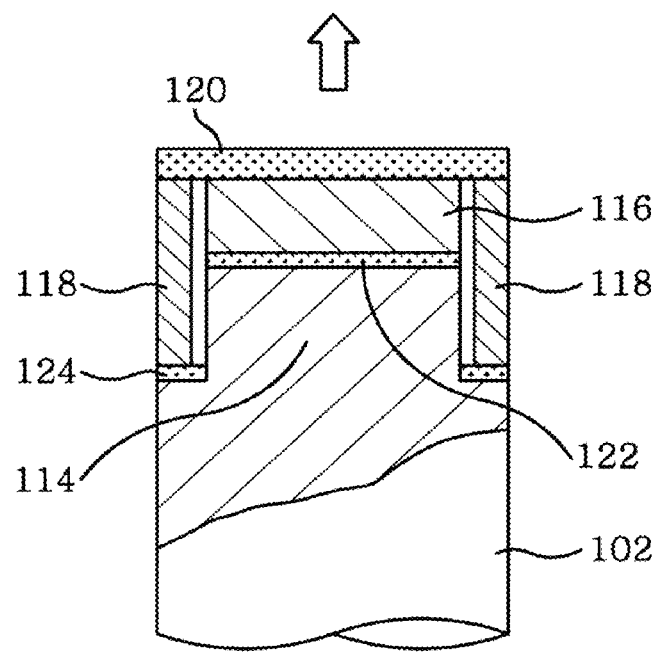

MOUNTING TABLE STRUCTURE, AND PROCESSING APPARATUS

This application is a Continuation Application of PCT International Application No. PCT/JP2008/050443 filed on Jan. 16, 2008, which designated the United States.

FIELD OF THE INVENTION

The present invention relates to a processing apparatus for performing heat treatments or plasma processing on a target object such as a semiconductor wafer or the like and a mounting table structure used in the processing apparatus.

BACKGROUND OF THE INVENTION

In the manufacture of semiconductor devices such as an integrated circuit (IC) and so forth, it is typical that a target object such as a semiconductor wafer or the like is repeatedly subjected to various kinds of processing such as film-forming, etching, heat-treating and reforming through the use of plasma or with no use of the same, thus producing a desired circuit device. For example, a single wafer processing apparatus is designed to perform heat treatments on a semiconductor wafer one by one. In this processing apparatus, a mounting table structure with a resistance heater and an electrostatic chuck is arranged inside a vacuum evacuable processing chamber. A semiconductor wafer is mounted on the upper surface of the mounting table structure. In this state, specific processing gases are fed to perform various kinds of heat treatments on the wafer under predetermined process conditions through the use of plasma or with no use of the same (see, e.g., Japanese Patent Laid-open Application Nos. 63(1988)-278322, 07(1995)-078766, 06(1994)-260430, 2004-356624, and 10(1998)-209255).

During the heat treatments, the semiconductor wafer is exposed to a high temperature and the processing chamber is supplied with a cleaning gas or corrosive gas such as an etching gas. In order to endure such a harsh environment, the mounting table structure for holding the semiconductor wafer tends to be made of ceramic represented by AlN (aluminum nitride). The heater and the electrostatic chuck are integrally molded from a ceramic material and buried in the mounting table structure.

Now, description will be made on one example of a conventional processing apparatus and a conventional mounting table structure. FIG. 14 is a schematic configuration diagram showing a conventionally available typical plasma processing apparatus. FIG. 15 is an enlarged cross sectional view showing a power-feeding portion of a mounting table structure. As shown in FIG. 14, a mounting table structure 4 for supporting a semiconductor wafer W on its upper surface is arranged within a cylindrical processing chamber 2. A shower head 6 as a gas introduction unit is provided in the ceiling portion of the processing chamber 2. In the lower surface of the shower head 6, there is formed a gas injection hole 6a through which to inject a necessary gas. A plasma-generating high-frequency power supply 8 of, e.g., 13.56 MHz, is connected to the shower head 6. The shower head 6 is designed to serve as an upper electrode.

The processing chamber 2 is provided with a gas exhaust port 10 formed in the bottom portion thereof so that the atmosphere within the processing chamber 2 can be evacuated through the exhaust port 10. The mounting table structure 4 includes a mounting table body 12 for holding the wafer W and a support column 14 upstanding from the bottom portion of the processing chamber 2 to support the mounting table body 12. The mounting table body 12 is made of a heat-resistant and corrosion-resistant material, e.g., ceramic such as AlN or the like. A lower electrode (not shown) to be supplied with high-frequency power and an electrode 16 serving as a chuck electrode of an electrostatic chuck are integrally buried in the mounting table body 12. A power-feeding rod 18 extends through the support column 14 and joins at its leading end to the electrode 16. If necessary, electric power is supplied from a power supply 20.

The joint structure between the electrode 16 and the upper end of the power-feeding rod 18 is shown in FIG. 15 which is an enlarged view of the area indicated by "A" in FIG. 14 (see, Japanese Patent Laid-open Application No. 10(1998)-209255). The electrode 16 within the mounting table body 12 is made of, e.g., Mo (molybdenum), W (tungsten) or an alloy thereof. A connection terminal 22 made of Mo or an alloy thereof is connected to the electrode 16 in advance. A recessed connection hole 24 is formed in the lower surface of the mounting table body 12. The connection terminal 22 is exposed into the connection hole 24 from the inner side of the latter. A power-feeding connector portion 26 provided at the tip end of the power-feeding rod 18 is inserted into the connection hole 24. A stress relaxing member 28 made of an alloy containing Co (cobalt) and/or Ni (nickel), e.g., Kovar (registered trademark) which is a Co—Fe—Ni alloy, is interposed between the power-feeding connector portion 26 and the Mo-containing connection terminal 22 in order to absorb the stress generated by the difference in thermal expansion. The connection terminal 22 and the stress relaxing member 28 are jointed to each other by, e.g., a Ni alloy brazing material 30. Likewise, the stress relaxing member 28 and the power-feeding connector portion 26 are jointed to each other by, e.g., a Ni alloy brazing material 32.

In the jointing process, the joint structure mentioned above is placed within a hot furnace in its entirety and baked at a high temperature. The power-feeding rod 18 and the power-feeding connector portion 26 are made of Ni (nickel) or its alloy. The leading end portion of the power-feeding rod 18 has a stepped portion and a reduced diameter portion, the latter of which serves as the power-feeding connector portion 26. A sleeve-shaped guide member 34 made of, e.g., Ni, is arranged on the outer circumferences of the power-feeding connector portion 26 and the stress relaxing member 28.

If the mounting table structure is repeatedly used at a high temperature of, e.g., 500° C. or more, the metals contained in the stress relaxing member 28, e.g., Fe, Ni and Co, are thermally diffused toward the connection terminal 22 and bonded to Mo. This creates a phenomenon that brittle intermetallic compounds are formed near the joint surfaces of the connection terminal 22 and the brazing material 30. Detachment occurs in the portion where the brittle intermetallic compounds exist, which poses a problem in that the power-feeding connector portion 26 is disconnected from the connection terminal 22.

This diffusion phenomenon is particularly remarkable in Co and Ni atoms. FIG. 16 is a diagrammatic image illustrating an electron micrograph of the area indicated by "B" in FIG. 15. It can be seen in FIG. 16 that the Co components present in the stress relaxing member 28 are thermally diffused into the brazing material 30 and further that a large quantity of Co elements 36 are accumulated in the interfacial surface area of the Mo-containing connection terminal 22 where it meets with the brazing material 30. Analysis reveals that the Ni components present in the stress relaxing member 28 and the brazing material 30 are also thermally diffused and accumulated in the boundary area of the connection terminal 22 where it meets with the brazing material 30. The phenomenon of becoming brittle would occur even if the material of the connection terminal 22 is changed from Mo to W (tungsten). There has existed a need to eliminate this phenomenon.

SUMMARY OF THE INVENTION

The present invention has been conceived in view of the problems mentioned above and made in an effort to effectively solve the problems. It is an object of the present invention to provide a mounting table structure capable of preventing occurrence of thermal diffusion of metal elements and joint strength reduction in the joint area between a connection terminal and a power-feeding connector portion and a processing apparatus using the mounting table structure.

In accordance with one aspect of the invention, there is provided a mounting table structure including: a mounting table body made of ceramic, the mounting table body including a power-receiving conductor portion buried therein, a surface formed with a recessed connection hole and a connection terminal electrically jointed to the power-receiving conductor portion and exposed into the connection hole, the connection terminal being made of a high-melting-point metal, an alloy thereof or a compound thereof; a power-feeding line member provided with a power-feeding connector portion, a leading end of the power-feeding line member being inserted into the connection hole to feed electricity to the power-receiving conductor portion; a stress relaxing member made of a conductive material and interposed between the connection terminal and the power-feeding connector portion to relax a stress; and a support column for supporting the mounting table body, wherein the stress relaxing member is made of a metal free from cobalt and nickel or an alloy thereof, and the stress relaxing member and the connection terminal are jointed together by a brazing material.

With this mounting table structure, the stress relaxing member and the connection terminal are jointed together by the brazing material, at which time the stress relaxing member is made of a metal free from cobalt and nickel or an alloy thereof. Therefore, it is possible to restrain occurrence of thermal diffusion of metal elements, especially cobalt and nickel, in the joint portion between the connection terminal and the power-feeding connector portion and to prevent joint strength reduction which would otherwise be caused by the thermal diffusion.

Preferably, the stress relaxing member is made of one or more materials selected from the group consisting of an Invar type alloy free from cobalt and nickel, an Elinvar type alloy free from cobalt and nickel, a Fe—Pd alloy, a Zr—Nb—Fe alloy, a Cr—Fe—Sn alloy and a Fe—B amorphous alloy.

In accordance with another aspect of the invention, there is provided a mounting table structure including: a mounting table body made of ceramic, the mounting table body including a power-receiving conductor portion buried therein, a surface formed with a recessed connection hole and a connection terminal electrically jointed to the power-receiving conductor portion and exposed into the connection hole, the connection terminal being made of a high-melting-point metal, an alloy thereof or a compound thereof; a power-feeding line member provided with a power-feeding connector portion, a leading end of the power-feeding line member being inserted into the connection hole to feed electricity to the power-receiving conductor portion; a stress relaxing member made of a conductive material and interposed between the connection terminal and the power-feeding connector portion to relax a stress; and a support column for supporting the mounting table body, wherein a boundary layer is provided on at least one of opposing surfaces of the stress relaxing member and the connection terminal, and the stress relaxing member and the connection terminal are jointed together by a brazing material.

With this mounting table structure, the stress relaxing member and the connection terminal are jointed together by the brazing material, at which time a boundary layer is formed on at least one of the opposing surfaces of the stress relaxing member and the connection terminal. Therefore, it is possible to restrain occurrence of thermal diffusion of metal elements, especially cobalt and nickel, in the joint portion between the connection terminal and the power-feeding connector portion and to prevent joint strength reduction which would otherwise be caused by the thermal diffusion.

It is preferred that the boundary layer is formed on the entire surface of the stress relaxing member and/or on the entire surface of the connection terminal. Further, the boundary layer may be made of one or more materials selected from the group consisting of rhenium, platinum family metals, metal nitride and metal silicide. Moreover, the brazing material may be free from nickel.

In accordance with still another aspect of the invention, there is provided a mounting table structure including: a mounting table body made of ceramic, the mounting table body including a power-receiving conductor portion buried therein, a surface formed with a recessed connection hole and a connection terminal electrically jointed to the power-receiving conductor portion and exposed into the connection hole, the connection terminal being made of a high-melting-point metal, an alloy thereof or a compound thereof; a power-feeding line member provided with a power-feeding connector portion, a leading end of the power-feeding line member being inserted into the connection hole to feed electricity to the power-receiving conductor portion; a stress relaxing member made of a conductive material and interposed between the connection terminal and the power-feeding connector portion to relax a stress; and a support column for supporting the mounting table body, wherein the connection terminal is made of an intermetallic compound with conductivity and oxidation resistance, and the connection terminal and the stress relaxing member are jointed together by a brazing material.

With this mounting table structure, the connection terminal is made of an intermetallic compound with conductivity and oxidation resistance, which keeps cobalt and nickel from being smelted by thermal diffusion. Therefore, even if the connection terminal and the stress relaxing member are jointed together by the brazing material, it is possible to restrain occurrence of thermal diffusion of metal elements, especially cobalt and nickel, in the joint portion between the connection terminal and the power-feeding connector portion and to prevent joint strength reduction which would otherwise be caused by the thermal diffusion.

Preferably, the intermetallic compound includes MoSi2 or Maxthal (registered trademark). Further, the power-feeding connector portion and the stress relaxing member may have outer circumferences surrounded by a cylindrical guide member.

In accordance with still another aspect of the invention, there is provided a mounting table structure including: a mounting table body made of ceramic, the mounting table body including a power-receiving conductor portion buried therein, a surface formed with a recessed connection hole and a connection terminal electrically jointed to the power-receiving conductor portion and exposed into the connection hole, the connection terminal being made of a high-melting-point metal, an alloy thereof or a compound thereof; a power-feeding line member provided with a power-feeding connector portion, a leading end of the power-feeding line member being inserted into the connection hole to feed electricity to the power-receiving conductor portion; and a support column for supporting the mounting table body, wherein a boundary layer for blocking diffusion of cobalt and nickel is provided on a surface of the connection terminal opposing the power-feeding connector portion, and the connection terminal and the power-feeding connector portion are jointed together by a brazing material.

With this mounting table structure, the stress relaxing member and the connection terminal are jointed together by the brazing material, at which time a boundary layer for blocking diffusion of cobalt and nickel is formed on the surface of the connection terminal opposing the power-feeding connector portion. Therefore, it is possible for the boundary layer to restrain occurrence of thermal diffusion of metal elements, especially cobalt and nickel, in the joint portion between the connection terminal and the power-feeding connector portion and to prevent joint strength reduction which would otherwise be caused by the thermal diffusion. In this case, it is preferable not to interpose the stress relaxing member between the connection terminal and the power-feeding connector portion.

In accordance with still another aspect of the invention, there is provided a mounting table structure including: a mounting table body made of ceramic, the mounting table body including a power-receiving conductor portion buried therein, a surface formed with a recessed connection hole and a connection terminal electrically jointed to the power-receiving conductor portion and exposed into the connection hole, the connection terminal being made of a high-melting-point metal, an alloy thereof or a compound thereof; a power-feeding line member provided with a power-feeding connector portion, a leading end of the power-feeding line member being inserted into the connection hole to feed electricity to the power-receiving conductor portion; and a support column for supporting the mounting table body, wherein the connection terminal and the power-feeding connector portion are configured to make mechanical contact with each other by a predetermined pressing force.

With this mounting table structure, the connection terminal and the power-feeding connector portion are configured to make mechanical contact with each other by a predetermined pressing force. Therefore, it is possible to restrain occurrence of thermal diffusion of metal elements, especially cobalt and nickel, in the joint portion between the connection terminal and the power-feeding connector portion. Even if the thermal diffusion would occur, the connection terminal and the power-feeding connector portion mechanically contacted by the pressing force are kept electrically connected to each other.

In accordance with still another aspect of the invention, there is provided a mounting table structure including: a mounting table body made of ceramic, the mounting table body including a power-receiving conductor portion buried therein, a surface formed with a recessed connection hole and a connection terminal electrically jointed to the power-receiving conductor portion and exposed into the connection hole, the connection terminal being made of a high-melting-point metal, an alloy thereof or a compound thereof; a power-feeding line member provided with a power-feeding connector portion, a leading end of the power-feeding line member being inserted into the connection hole to feed electricity to the power-receiving conductor portion; and a support column for supporting the mounting table body, wherein the connection terminal and the power-feeding connector portion are made of an intermetallic compound with conductivity and oxidation resistance, and the connection terminal and the power-feeding connector portion are jointed together by welding.

With this mounting table structure, the connection terminal and the power-feeding connector portion are made of an intermetallic compound with conductivity and oxidation resistance, and are jointed together by welding. Therefore, it is possible to restrain occurrence of thermal diffusion of metal elements, especially cobalt and nickel, in the joint portion between the connection terminal and the power-feeding connector portion and to prevent joint strength reduction which would otherwise be caused by the thermal diffusion.

In accordance with still another aspect of the invention, there is provided a mounting table structure including: a mounting table body made of ceramic, the mounting table body including a power-receiving conductor portion buried therein, a surface formed with a recessed connection hole and a connection terminal electrically jointed to the power-receiving conductor portion and exposed into the connection hole, the connection terminal being made of a high-melting-point metal, an alloy thereof or a compound thereof; a power-feeding line member provided with a power-feeding connector portion, a leading end of the power-feeding line member being inserted into the connection hole to feed electricity to the power-receiving conductor portion; and a support column for supporting the mounting table body, wherein the connection terminal is made of an intermetallic compound with conductivity and oxidation resistance, and the connection terminal and the power-feeding connector portion are jointed together by a brazing material.

With this mounting table structure, the connection terminal and the power-feeding connector portion are jointed together by the brazing material, at which time the connection terminal is made of an intermetallic compound with conductivity and oxidation resistance. Therefore, it is possible to restrain occurrence of thermal diffusion of metal elements, especially cobalt and nickel, in the joint portion between the connection terminal and the power-feeding connector portion and to prevent joint strength reduction which would otherwise be caused by the thermal diffusion.

It is preferred that the intermetallic compound includes MoSi2 or Maxthal (registered trademark).

In accordance with still another aspect of the invention, there is provided a mounting table structure including: a mounting table body made of ceramic, the mounting table body including a power-receiving conductor portion buried therein, a surface formed with a recessed connection hole and a connection terminal electrically jointed to the power-receiving conductor portion and exposed into the connection hole, the connection terminal being made of a high-melting-point metal, an alloy thereof or a compound thereof; a power-feeding line member provided with a power-feeding connector portion, a leading end of the power-feeding line member being inserted into the connection hole to feed electricity to the power-receiving conductor portion; and a support column for supporting the mounting table body, wherein the connection terminal and the power-feeding connector portion are all made of a high-melting-point metal, and the connection terminal and the power-feeding connector portion are jointed together by a brazing material.

With this mounting table structure, the connection terminal and the power-feeding connector portion are all made of a high-melting-point metal and jointed together by the brazing material. Therefore, it is possible to prevent occurrence of thermal diffusion of metal elements in the joint portion between the connection terminal and the power-feeding connector portion and to prevent deterioration in joint strength.

Preferably, he power-feeding connector portion and the power-feeding line member are connected to each other by thread coupling. Further, the brazing material may be a material selected from the group consisting of an Au brazing material composed of Au and an Ag—Ti brazing material composed of Ag and Ti.

It is preferred that the high-melting-point metal is one or more materials selected from the group consisting of molybdenum (Mo), a molybdenum alloy (a Mo alloy), tungsten (W) and a tungsten alloy (a W alloy).

Preferably, the power-receiving conductor portion includes a heater portion serving as a heat-generating body. Further, the power-receiving conductor portion may include a chuck electrode for an electrostatic chuck. Moreover, the power-receiving conductor portion may include a lower electrode supplied with high-frequency power.

It is preferred that a metal film made of the same material as the brazing material is formed on the surfaces of the respective members jointed by the brazing material in advance.

In accordance with still another aspect of the invention, there is provided a processing apparatus for processing a target object, including: a vacuum evacuable processing chamber; the mounting table structure, as described above, provided within the processing chamber for holding the target object; and a gas introduction unit for introducing a gas into the processing chamber. Preferably, an inert gas is supplied into the mounting table structure.

BRIEF DESCRIPTION OF THE DRAWINGS

FIG. 4 is a partially enlarged cross sectional view illustrating an exploded state of the mounting table structure.

BEST MODE FOR CARRYING OUT THE INVENTION

Figure 1:
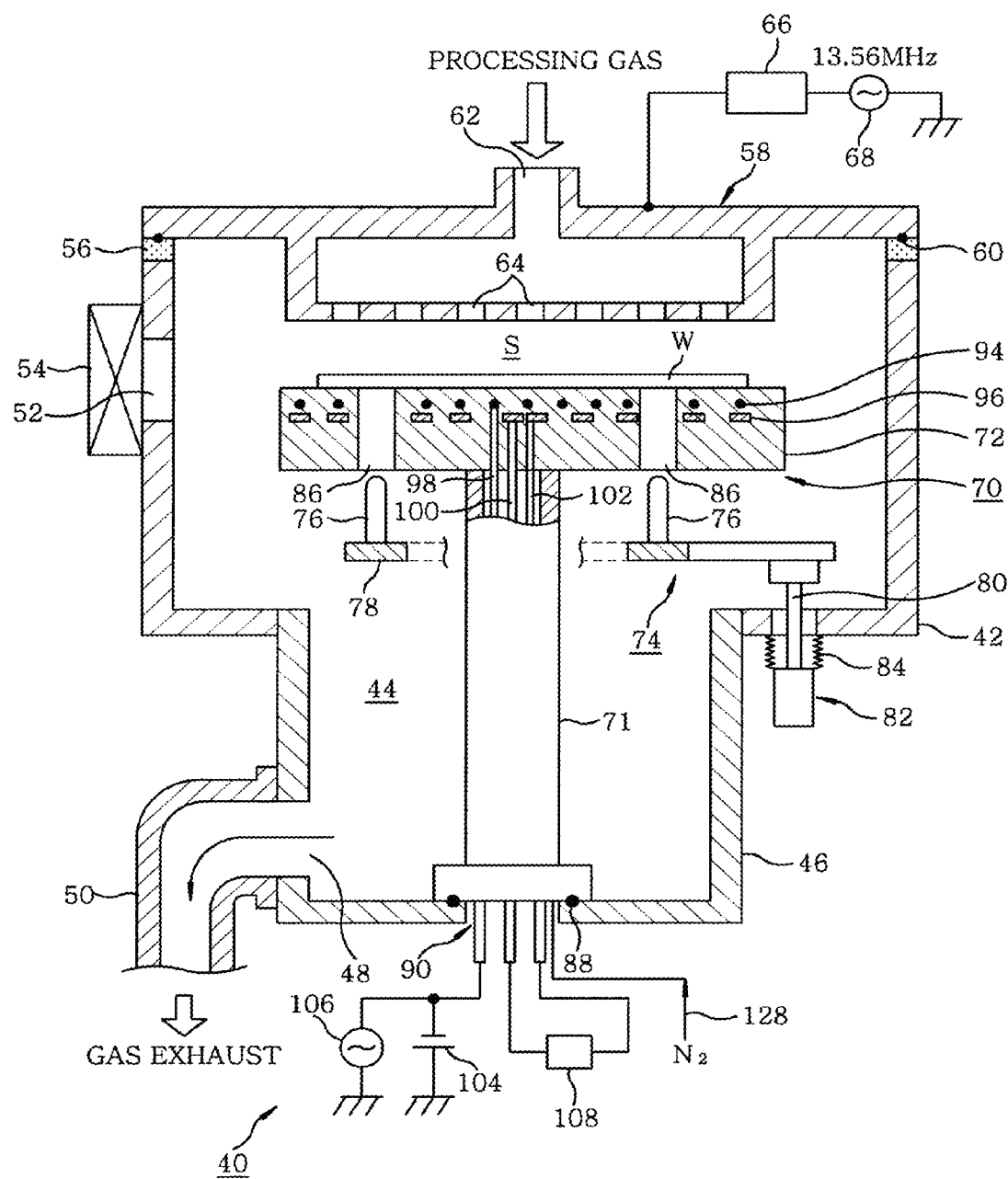
FIG. 1 is a configuration view showing a processing apparatus in accordance with the present invention.
Figure 2:
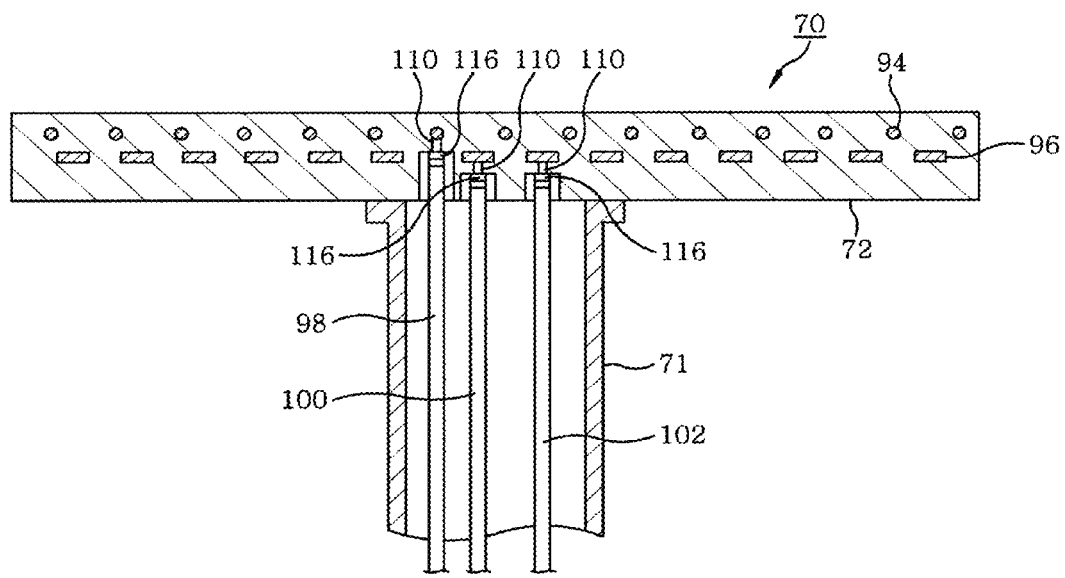
FIG. 2 is a partial cross sectional view showing a mounting table structure in accordance with the present invention, which is employed in the processing apparatus.
Figure 3:
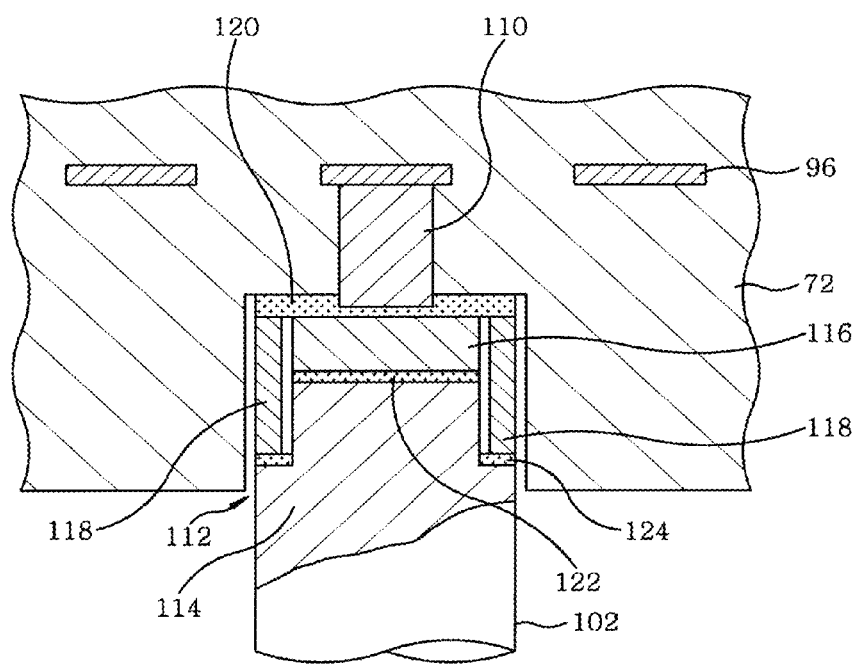
FIG. 3 is a partially enlarged cross sectional view showing a first embodiment of the mounting table structure.

Hereinafter, preferred embodiments of a mounting table structure and a processing apparatus in accordance with the present invention will be described with reference to the accompanying drawings. FIG. 1 is a configuration view showing a processing apparatus in accordance with the present invention. FIG. 2 is a partial cross sectional view showing a mounting table structure in accordance with the present invention, which is employed in the processing apparatus. FIG. 3 is a partially enlarged cross sectional view showing a first embodiment of the mounting table structure. FIG. 4 is a partially enlarged cross sectional view illustrating an exploded state of the mounting table structure.

<First Embodiment>

A parallel-plate type plasma processing apparatus will be described herein as an example of the present processing apparatus. As shown in FIG. 1, the parallel-plate type plasma processing apparatus 40 includes a hollow processing chamber 42 made of, e.g., an aluminum alloy. The processing chamber 42 has a downwardly recessed central bottom portion that forms an exhaust space 44. The exhaust space 44 is defined by a cylindrical body 46 with a bottom. The bottom of the cylindrical body 46 forms a portion of the bottom portion of the processing chamber 42. An exhaust port 48 is provided in the side portion of the cylindrical body 46. An exhaust pipe 50, along which a pressure regulating valve and a vacuum pump not shown in the drawings are arranged, is connected to the exhaust port 48 so that the interior of the processing chamber 42 can be evacuated into a desired vacuum pressure.

A gateway 52 through which to load and unload a semiconductor wafer W as a target object is formed in the sidewall of the processing chamber 42. A gate valve 54 opened when loading and unloading the wafer W is installed in the gateway 52.

The processing chamber 42 has a top opening to which a shower head 58 as a gas introduction means is attached through an insulation member 56. A seal member 60 formed of, e.g., an O-ring, is interposed between the shower head 58 and the insulation member 56 to keep the processing chamber 42 air-tight. The shower head 58 has a gas inlet port 62 formed in the upper portion thereof. The shower head 58 has a lower gas injection surface and a plurality of gas injection holes 64 formed in the gas injection surface so that necessary processing gases can be injected toward a processing space S. Although the shower head 58 has a single internal space in the illustrated example, it may be of the type having a plurality of internal spaces, in which case different gases are not mixed within the shower head 58 but independently supplied into the processing space S.

The shower head 58 functions as a plasma-generating upper electrode. More specifically, a plasma-generating high-frequency power supply 68 is connected to the shower head 58 through a matching circuit 66. The high-frequency power supply 68 has a frequency of, e.g., 13.56 MHz. However, the frequency of the power supply 68 is not limited thereto. A mounting table structure 70 in accordance with the present invention is installed within the processing chamber 42 to hold a semiconductor wafer W. The mounting table structure 70 essentially includes a generally disk-shaped mounting table body 72 for directly holding the wafer W on its top surface and a cylindrical support column 71 upstanding from the bottom portion of the processing chamber 42 to support the mounting table body 72.

A lifting pin mechanism 74 for lifting and supporting the wafer W when loading and unloading the same is provided below the mounting table body 72. The lifting pin mechanism 74 includes a plurality of, e.g., three, lifting pins 76 (only two of which are shown in the illustrated example) arranged in an equal interval along the circumference of the mounting table body 72 and a pin base plate 78 of, e.g., arc shape, arranged to support the lower end portions of the respective lifting pins 76. The pin base plate 78 is connected to a lifting rod 80 extending through the bottom portion of the processing chamber 42. The lifting rod 80 can be moved up and down by an actuator 82. An extendible bellows 84, which permits up-and-down movement of the lifting rod 80 while keeping the processing chamber 42 air-tight, is provided below the through-hole of the bottom portion of the processing chamber 42.

The mounting table body 72 has pin insertion holes 86 formed in alignment with the respective lifting pins 76. As the lifting rod 80 is moved up and down, the lifting pins 76 inserted into the pin insertion holes 86 is extended above or retracted below the target object holding surface to lift up or lower down the wafer W. The mounting table body 72 and the support column 71 are made of a material free from metal contamination and superior in heat resistance, e.g., ceramic. In order to keep the processing chamber 42 air-tight, the lower end portion of the support column 71 is fixed by bolts not shown in the drawings to the peripheral portion of an opening 90 formed in the bottom portion of the processing chamber 42, with a seal member 88 such as an O-ring or the like interposed therebetween. As the ceramic of which the mounting table body 72 and the support column 71 are made, it is possible to use aluminum nitride (AlN), aluminum oxide ($Al_2O_3$), silicon carbide (SiC), quartz ($SiO_2$) and so forth.

As shown in FIG. 2, a chuck electrode 94 of an electrostatic chuck as a first power-receiving conductor portion and a heater portion 96, i.e., a heat generating body, as a second power-receiving conductor portion are buried in the mounting table body 72. The chuck electrode 94 is provided just below the target object holding surface to attract and hold the wafer W with an electrostatic force. The heater portion 96 is arranged below the chuck electrode 94 to heat the wafer W.

In the illustrated embodiment, the chuck electrode 94 also functions as a lower electrode to which a bias voltage is supplied during plasma generation. The chuck electrode 94 and the heater portion 96 are made of a high-melting-point metal such as W, Mo, V, Cr, Mn, Nb, Ta or the like, a compound of the high-melting-point metal, or an alloy containing the high-melting-point metal. In this embodiment, the chuck electrode 94 and the heater portion 96 are mainly made of Mo, W or an alloy containing at least one of Mo and W.

A power-feeding line member 98 is connected to the chuck electrode 94. Power-feeding line members 100 and 102 are connected to the heater portion 96. The respective power-feeding line members 98, 100 and 102 pass through the internal space of the cylindrical support column 71 hermetically isolated from the internal space of the processing chamber 42 and extends downward through the opening 90 formed in the bottom portion of the processing chamber 42. A direct current power supply 104 for the electrostatic chuck and a biasing high-frequency power supply 106 are connected to the power-feeding line member 98 for the chuck electrode 94. A heater power supply 108 is connected to the power-feeding line members 100 and 102 for the heater portion 96. Although the heater portion 96 is configured to uniformly heat the mounting table body 72 in the illustrated embodiment (which is referred to as a single zone heating), it may be possible, e.g., to define a plurality of heating zones concentrically with the mounting table body 72 and to heat the respective heating zones independently of one another with different heater portions. In this case, the power-feeding line members 100 and 102 are provided in a corresponding relationship with the respective heater portions. If necessary, the power-feeding line member 98 may be directly connected to the ground.

The joint structures by which the chuck electrode 94 and the heater portion 96 are joined to the power-feeding line members 98, 100 and 102 are all the same. Only the joint structure for joining the heater portion 96 and the power-feeding line member 102 together will be representatively described herein with reference to FIGS. 3 and 4.

As shown in FIGS. 3 and 4, the heater portion 96 is buried in the mounting table body 72 with a connection terminal 110 connected thereto in advance. A recessed portion, i.e., a connection hole 112, is formed on the lower surface of the mounting table body 72. The tip end portion (or the lower end portion) of the connection terminal 110 is exposed from the inner end (or the upper surface) of the connection hole 112 into the internal space of the latter. The connection terminal 110 can be made of a high-melting-point metal such as W, Mo, Nb, Ta or the like, or such high-melting-point metal based alloy, or an intermetallic compound containing the high-melting-point metal (e.g., $MoSi_2$, $Ti_5Si_3$, NiAl, $TiAl_3$, $NbAl_3$, $ZrAl_3$, $Mo_3Al_3$ or $Nb_3Al$). In the illustrated embodiment, the connection terminal 110 is made of a material mainly containing Mo or W.

In the illustrated embodiment, the power-feeding line member 102 is formed of a power-feeding rod in its entirety. The upper end portion of the power-feeding line member 102 has a stepped portion and a reduced diameter portion extending upwards from the stepped portion, the latter of which serves as a power-feeding connector portion 114. The upper end portion of the power-feeding line member 102 may be used as the power-feeding connector portion 114 without having to form the reduced diameter portion. The power-feeding line member 102 is made of, e.g., Ni. A stress relaxing member 116 made of a conductive material is interposed between the power-feeding connector portion 114 and the connection terminal 110 to relax the stress created between them. A sleeve-shaped guide member 118 made of, e.g., Ti, is mounted on the outer circumferences of the stress relaxing member 116 and the power-feeding connector portion 114. The connection terminal 110 is jointed to one ends of the stress relaxing member 116 and the guide member 118 by, e.g., a brazing material 120 free from Ni but containing at least one of Pd, Ag and Ti. The stress relaxing member 116 is jointed to the power-feeding connector portion 114 by, e.g., a brazing material 122 free from Ni but containing at least one of Pd, Ag and Ti. The other end of the guide member 118 is jointed to the power-feeding line member 102 by, e.g., a brazing material 124 free from Ni but containing at least one of Pd, Ag and Ti.

The stress relaxing member 116 is made of a material with a low thermal expansion coefficient, namely a metal free from cobalt (Co) and nickel (Ni) or its alloy. More specifically, it is possible to use, as the stress relaxing member 116, one or more materials selected from the group consisting of an Invar type alloy free from cobalt and nickel, an Elinvar type alloy free from cobalt and nickel, a Fe—Pd alloy, a Zr—Nb—Fe alloy, a Cr—Fe—Sn alloy and a Fe—B amorphous alloy. Examples of the Invar type alloy include a Fe-46Pd alloy and a Fe-17at % B alloy. In this way, the material of the stress relaxing member 116 does not contain cobalt and nickel which would make a brittle compound with Mo. This prevents cobalt and nickel from being diffused toward the connection terminal 110 mainly composed of Mo, which would occur in the conventional mounting table structure.

As shown in FIG. 4, the stress relaxing member 116, the brazing materials 120, 122 and 124 and the guide member 118 are provisionally mounted to the power-feeding connector portion 114, i.e., the leading end portion of the power-feeding line member 102. This provisional assembly is inserted into the connection hole 112 and heated in that state so that it can be jointed together by the brazing materials. As a result, the power-feeding line member 102 is connected to the mounting table body 72 made of ceramic. As mentioned earlier, the joint structures of the respective power-feeding line members 98, 100 and 102 are the same. Referring again to FIG. 1, an inert gas such as $N_2$ or the like (including a rare gas such as Ar or the like) is introduced from an inert gas supply unit 128 into the cylindrical support column 71, thereby preventing oxidation of the respective metallic surfaces.

Next, description will be made on the operation of the plasma processing apparatus 40 configured as above. First, an untreated semiconductor wafer W is held by a transportation arm not shown in the drawings and is loaded into the processing chamber 42 through the open gate valve 54 and the gateway 52. The wafer W is transferred to the raised lifting pins 76. Thereafter, the lifting pins 76 are lowered down to place the wafer W on the upper surface of the mounting table body 72 of the mounting table structure 70.

Then, a film-forming gas as one example of various kinds of processing gases is supplied to the shower head 58 at a controlled flow rate and injected from the gas injection holes 64 into the processing space S. Although not shown in the drawings, the vacuum pump arranged in the exhaust pipe 50 is continuously driven to evacuate the atmosphere within the processing chamber 42 and the exhaust space 44. The atmosphere within the processing space S is kept at a specified process pressure by adjusting the opening degree of the pressure regulating valve. At this time, the temperature of the wafer W is maintained at a predetermined value. In other words, electricity is supplied from the heater power supply 108 to the heater portion 96 of the mounting table body 72 via the power-feeding line members 100 and 102. Thus the heater portion 96 generates heat, thereby heating the mounting table body 72 as a whole.

As a result, the wafer W placed on the mounting table body 72 is heated. At this time, the wafer temperature is measured by a thermocouple (not shown) provided in the mounting table body 72. The wafer temperature is controlled depending on the values thus measured. Simultaneously, the high-frequency power supply 68 is operated to perform plasma processing. High frequency waves are supplied to between the shower head 58 as an upper electrode and the mounting table body 72 as a lower electrode, thus generating plasma in the processing space S. At the same time, an electric voltage is fed to the chuck electrode 94 of the electrostatic chuck to electrostatically attract the wafer W. Specified plasma processing is performed in this state. At this time, high frequency power are supplied from the biasing high-frequency power supply 106 to the chuck electrode 94 of the mounting table body 72, thereby making it possible to implant plasma ions.

Figure 15:
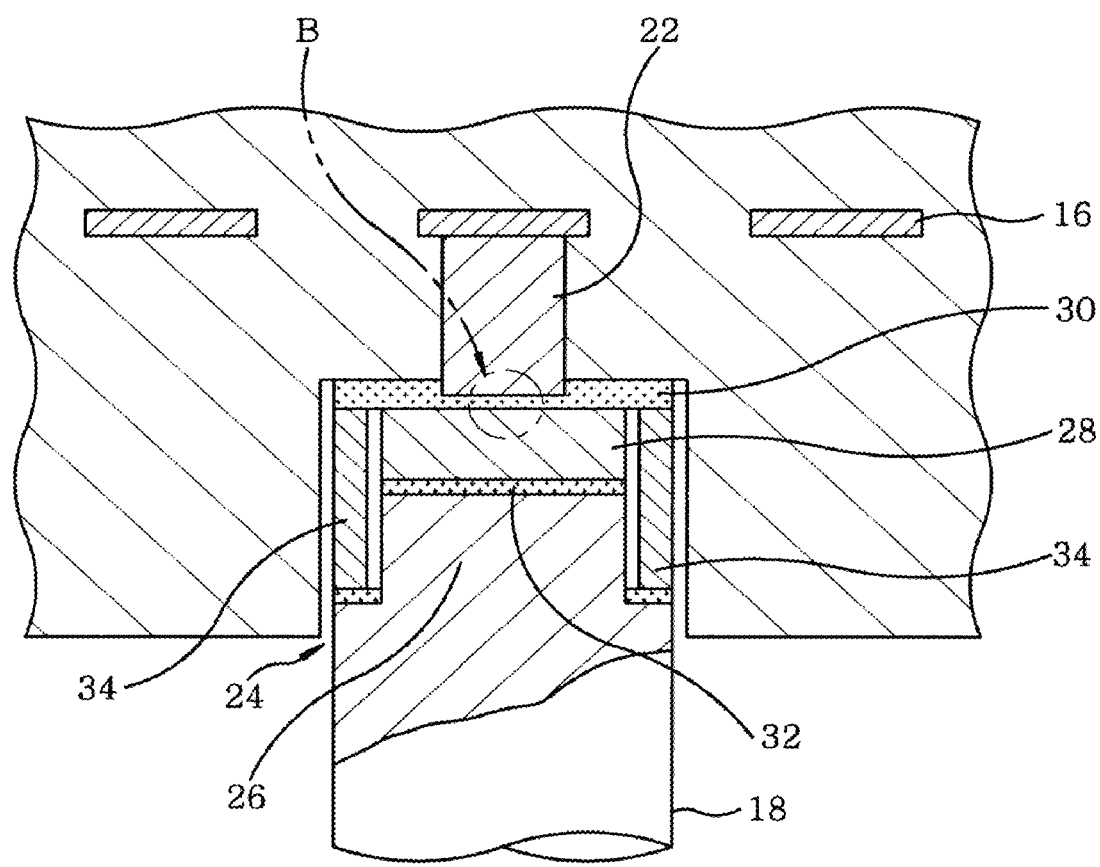
FIG. 15 is an enlarged cross sectional view illustrating a power-feeding portion of a conventional mounting table structure.

The mounting table body 72 is exposed to a high temperature each time the wafer W is subjected to such processing. This temperature is sometimes raised up to about 700° C. depending on the type of processing. Such exposure to a high temperature leads to a possibility that the respective metal elements in the materials of the respective members may be thermally diffused depending on the diffusion coefficient thereof. In the conventional mounting table structure described earlier with reference to FIGS. 15 and 16, cobalt and nickel contained in the stress relaxing member 28 or nickel contained in the brazing material are diffused toward the connection terminal 22 to thereby form brittle intermetallic compounds. Therefore, there is a fear that detachment or other problems may occur in the boundary between the intermetallic compounds and the region where cobalt and nickel are not diffused.

In case of the first embodiment of the present invention, however, the stress relaxing member 116 is free from cobalt and nickel. In other words, the stress relaxing member 116 is made of a metal containing neither cobalt nor nickel or its alloy. Thanks to this feature, there is formed no brittle intermetallic compound which would otherwise be created by the diffusion of cobalt and nickel. Furthermore, since the brazing materials are free from nickel, there is formed no brittle intermetallic compound which would otherwise be created by the diffusion of nickel. This makes it possible to prevent the power-feeding line member 102 from being detached and separated from the connection terminal 110. These advantageous effects are equally available in the respective power-feeding line members 98, 100 and 102 that have the same joint structure.

As stated above, the stress relaxing member 116 is made of a metal containing neither cobalt nor nickel or its alloy, and the stress relaxing member 116 and the connection terminal 110 are jointed together by the brazing material free from nickel. Therefore, it is possible to prevent joint strength reduction in the joint portion between the connection terminal 110 and the power-feeding connector portion 114, which would otherwise be caused by the thermal diffusion of metal elements, especially cobalt and nickel.

<Second Embodiment>

Figure 5:
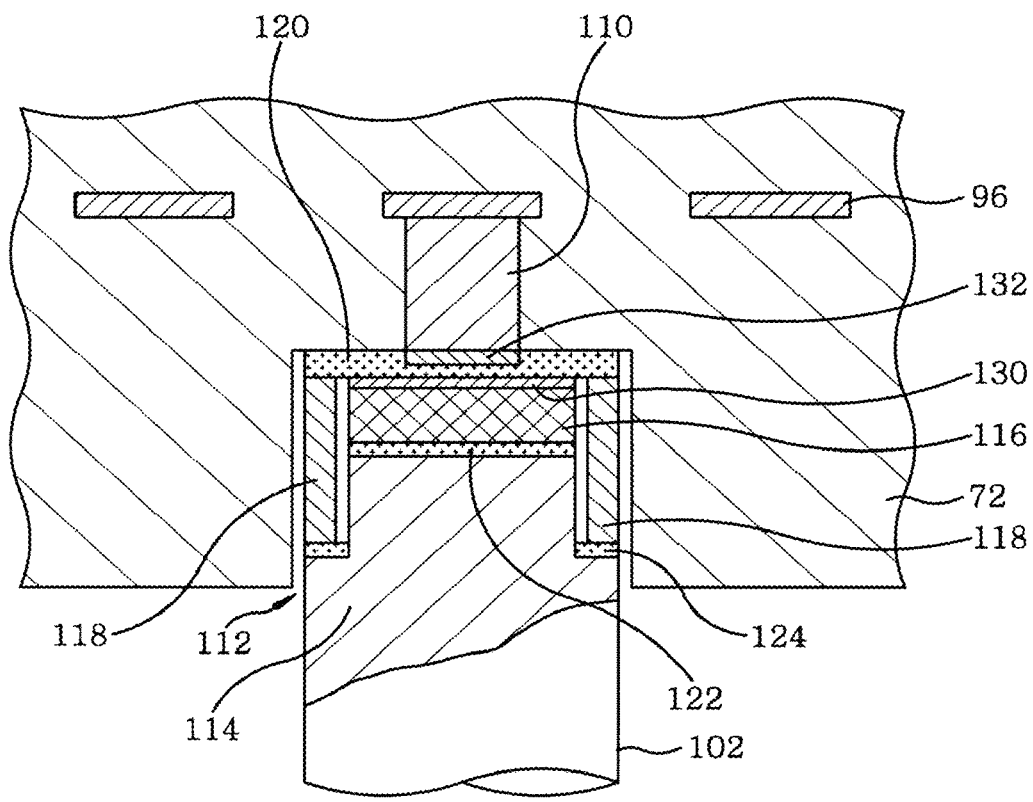
FIG. 5 is an enlarged cross sectional view showing major parts of a second embodiment of the mounting table structure in accordance with the present invention.
Figure 6:
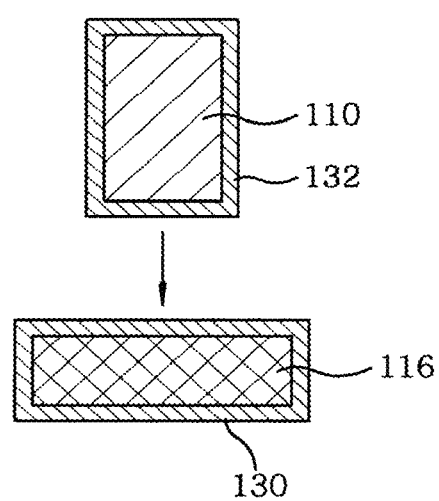
FIG. 6 is a view showing a modified example of a stress relaxing member and a connection terminal employed in the second embodiment of the mounting table structure.

Next, description will be made on a second embodiment of the mounting table structure in accordance with the present invention. FIG. 5 is an enlarged cross sectional view showing major parts of a second embodiment of the mounting table structure in accordance with the present invention. FIG. 6 is a view showing a modified example of the stress relaxing member and the connection terminal employed in the second embodiment of the mounting table structure. The same component parts as those illustrated in FIGS. 2 through 4 are designated by like reference numerals in FIGS. 5 and 6 and will be omitted from description. In case of the foregoing first embodiment, cobalt and nickel are excluded from the material of the stress relaxing member 116. In the second embodiment, there are provided boundary layers for blocking the diffusion of cobalt and nickel.

More specifically, as shown in FIG. 5, boundary layers 130 and 132 for blocking the diffusion of cobalt and nickel are formed on the opposing surfaces of the stress relaxing member 116 and the connection terminal 110 to prevent cobalt and nickel from being diffused from the stress relaxing member 116. The stress relaxing member 116 and the connection terminal 110 are jointed together by a brazing material 120 containing at least one of Ni, Pd, Ag and Ti.

Figure 16:
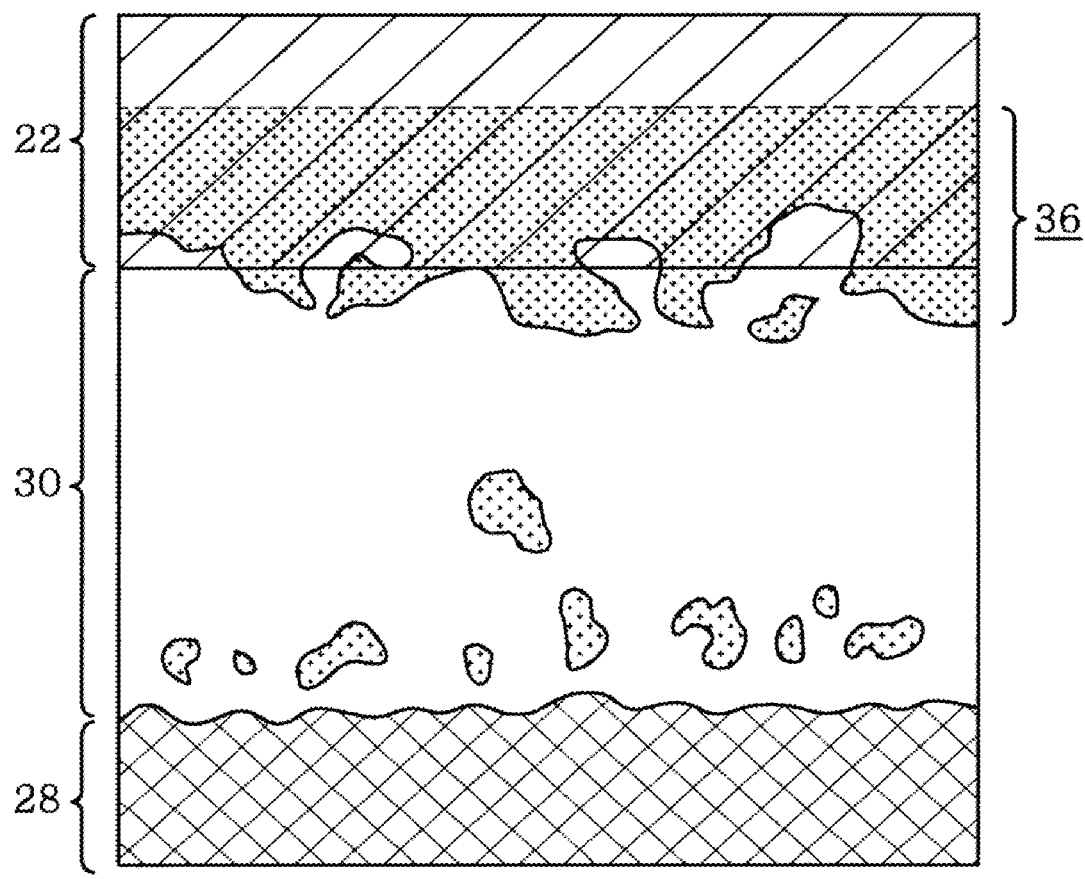
FIG. 16 is a diagrammatic image illustrating an electron micrograph of the area indicated by "B" in FIG. 15.

In this case, it is apparent from the foregoing description that the stress relaxing member free from cobalt and nickel as in the first embodiment or the stress relaxing member containing cobalt and/or nickel as in the conventional structure illustrated in FIG. 16 may be used as the stress relaxing member 116.

The boundary layers 130 and 132 can be made of one or more materials selected from the group consisting of rhenium, platinum family metals, metal nitride and metal silicide. In addition to Re (rhenium), it is possible to use, as the platinum family metals, e.g., Ru (ruthenium), Ir (iridium), Pt (platinum) or the like. TiN, TaN or the like can be used as the metal nitride and $MoSi_2$ or the like can be used as the metal silicide. In case the connection terminal 110 contains a large amount of Mo, it is preferred that Re, Pt or an alloy mainly composed of Re or Pt is used as the boundary layers 130 and 132. In case the connection terminal 110 contains a large amount of W, it is preferable to use, as the boundary layers 130 and 132, Re, Ru, Ir, Pt or an alloy of two or more metals selected from Re, Ru, Ir and Pt (e.g., a Re—Ru alloy, a Re—Ir alloy, a Re—Pt alloy, a Ru—Ir alloy, a Ru—Pt alloy, a Ir—Pt alloy, a Re—Ru—Ir alloy, a Re—Ru—Pt alloy, a Re—Ir—Pt alloy, a Ru—Ir—Pt alloy or a Re—Ru—Ir—Pt alloy).

As shown in FIG. 6, the entire surfaces of the connection terminal 110 and/or the stress relaxing member 116 may be covered with the boundary layers 130 and 132, in which case it is possible to effectively prevent creation of brittle intermetallic compounds attributable to the diffusion of cobalt and nickel.

In this way, the boundary layers 130 and 132 are formed on the opposing surfaces of the stress relaxing member 116 and the connection terminal 110, and the stress relaxing member 116 and the connection terminal 110 are jointed together by the brazing material 120. This makes it possible to prevent joint strength reduction in the joint portion between the connection terminal 110 and the power-feeding connector portion 114, which would otherwise be caused by the thermal diffusion of metal elements, especially cobalt and nickel. Although the boundary layers 130 and 132 are formed on the opposing surfaces of the stress relaxing member 116 and the connection terminal 110 in the illustrated embodiment, it may be possible to form the boundary layer 132 alone. In this case, it is necessary to ensure that the brazing material 120 does not contain Ni.

<Third Embodiment>

Figure 7:
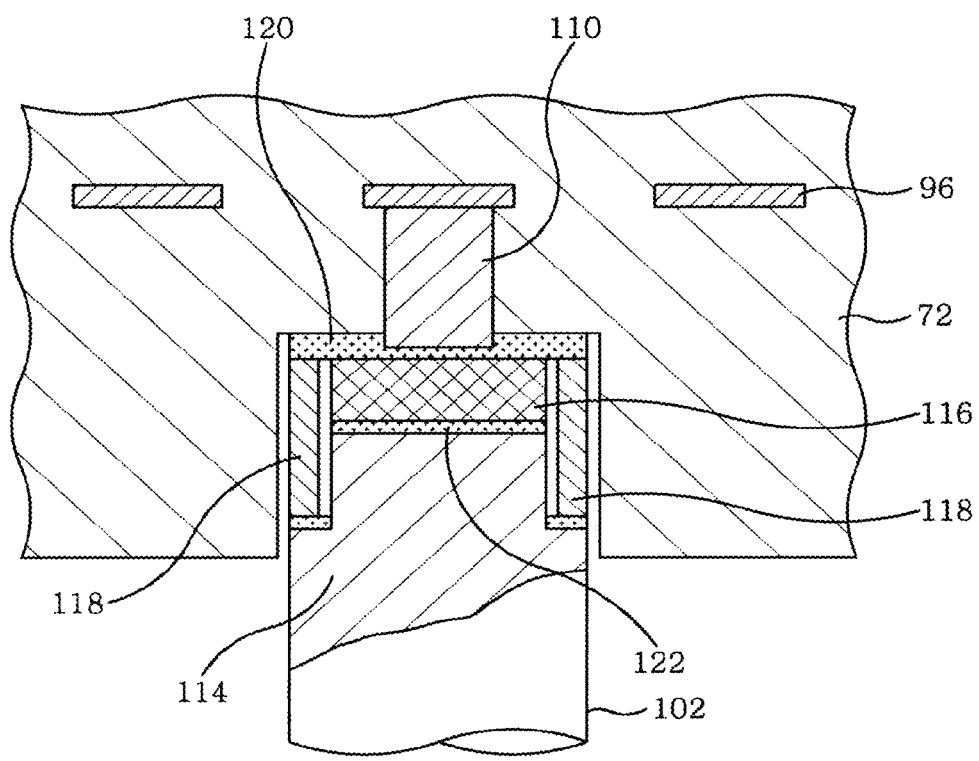
FIG. 7 is an enlarged cross sectional view showing major parts of a third embodiment of the mounting table structure in accordance with the present invention.

Next, description will be made on a third embodiment of the mounting table structure in accordance with the present invention. FIG. 7 is an enlarged cross sectional view showing major parts of a third embodiment of the table structure in accordance with the present invention. The same component parts as those illustrated in FIGS. 2 through 6 are designated by like reference numerals in FIG. 7 and will be omitted from description. In case of the foregoing first embodiment, cobalt and nickel are excluded from the material of the stress relaxing member 116. In the third embodiment, a material capable of preventing the thermal diffusion and smelting of cobalt and nickel is used as the material of the connection terminal 110.

More specifically, as shown in FIG. 7, an intermetallic compound with conductivity and oxidation resistance is used as the material of the connection terminal 110. The connection terminal 110 and the stress relaxing member 116 are jointed together by the brazing material 120. In this regard, $MoSi_2$ or Maxthal (registered trademark) can be used as the intermetallic compound that forms the connection terminal 110. As a specific example of Maxthal, it is possible to use Maxthal 312 and 211.

In this case, it is apparent from the foregoing description that the stress relaxing member free from cobalt and nickel as in the first embodiment or the stress relaxing member containing cobalt and/or nickel as in the conventional structure illustrated in FIG. 16 may be used as the stress relaxing member 116.

In this way, the connection terminal 110 is made of the intermetallic compound with conductivity and oxidation resistance, and the connection terminal 110 and the stress relaxing member 116 are jointed together by the brazing material 120 containing at least one of Ni, Pd, Ag and Ti. This makes it possible to prevent joint strength reduction in the joint portion between the connection terminal 110 and the power-feeding connector portion 114, which would otherwise be caused by the thermal diffusion of metal elements, especially cobalt and nickel. In the first to third embodiments described above, it may be possible to omit the guide member 118.

<Fourth Embodiment>

Figure 8:
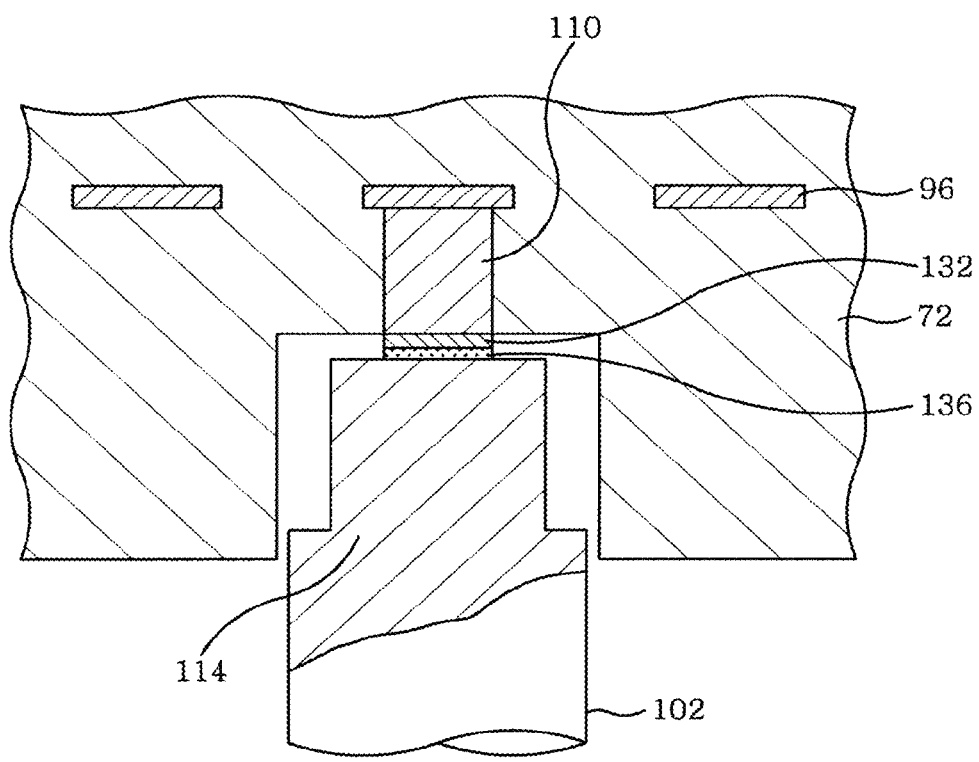
FIG. 8 is an enlarged cross sectional view showing major parts of a fourth embodiment of the mounting table structure in accordance with the present invention.

Next, description will be made on a fourth embodiment of the mounting table structure in accordance with the present invention. FIG. 8 is an enlarged cross sectional view showing major parts of a fourth embodiment of the mounting table structure in accordance with the present invention. The same component parts as those illustrated in FIGS. 2 through 7 are designated by like reference numerals in FIG. 8 and will be omitted from description. Although the stress relaxing member 116 is employed in case of the foregoing first to third embodiments, the connection terminal 110 and the power-feeding connector portion 114 are directly connected in the fourth embodiment without having to employ the stress relaxing member 116. In the fourth embodiment, a boundary layer for blocking the diffusion of cobalt and nickel is provided on the surface of the connection terminal 110 opposing the power-feeding connector portion 114.

More specifically, as shown in FIG. 8, the connection terminal 110 containing, e.g., Mo, and the power-feeding connector portion 114 containing Ni are directly connected without having to employ the stress relaxing member 116 used in the foregoing embodiments. A boundary layer 132 for preventing the diffusion of cobalt and nickel is provided on the surface of the connection terminal 110 opposing the power-feeding connector portion 114. The boundary layer 132 prevents cobalt and nickel from being diffused from the power-feeding connector portion 114 and the brazing material 136 into the connection terminal 110. In this regard, the connection terminal 110 and the power-feeding connector portion 114 are jointed together by the brazing material 136 containing, e.g., at least one of Ni, Pd, Ag and Ti. The guide member 118 (see FIG. 3) is not employed in the fourth embodiment. In this case, the Mo-containing material described in respect of the first embodiment shown in FIG. 3 or the intermetallic compound described in respect of the third embodiment shown in FIG. 7 may be used as the material of the connection terminal 110. Since the stress relaxing member 116 containing cobalt and/or nickel is not employed in this embodiment, it is possible to eliminate the problem caused by the thermal diffusion of cobalt and/or nickel. In this embodiment, the boundary layer 132 can be made of the same material as used in the second embodiment.

In the manner as noted above, the boundary layer 132 is provided on the surface of the connection terminal 110 opposing the power-feeding connector portion 114, and the connection terminal 110 and the power-feeding connector portion 114 are jointed together by the brazing material 136. Therefore, the boundary layer 132 can prevent joint strength reduction in the joint portion between the connection terminal 110 and the power-feeding connector portion 114, which would otherwise be caused by the thermal diffusion of metal elements, especially cobalt and nickel.

<Fifth Embodiment>

Figure 9:
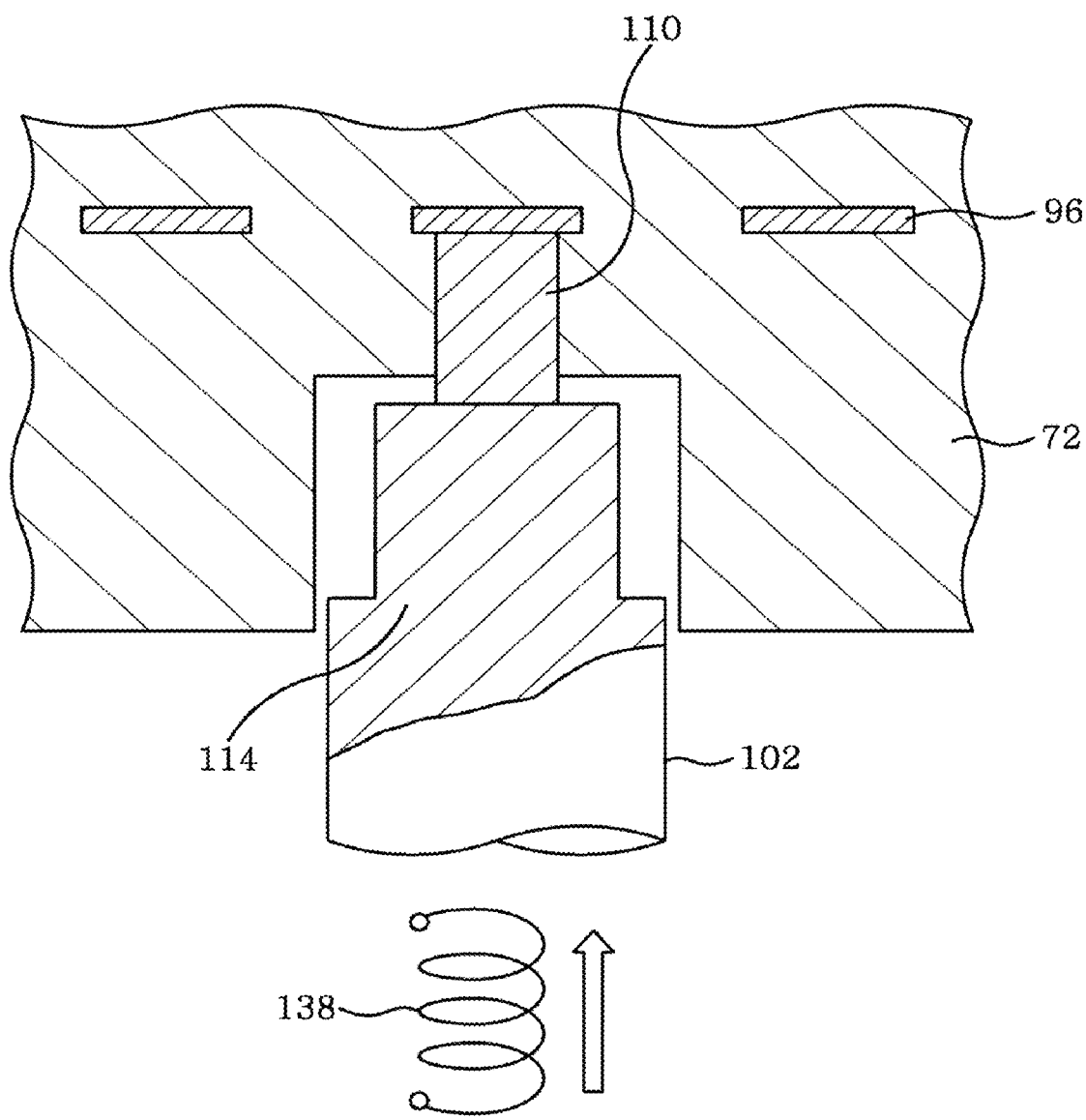
FIG. 9 is an enlarged cross sectional view showing major parts of a fifth embodiment of the mounting table structure in accordance with the present invention.

The brazing material 136 may be omitted from the mounting table structure of the fourth embodiment, and the connection terminal 110 and the power-feeding connector portion 114 may be brought into direct mechanical contact with each other as in the enlarged view of the fifth embodiment shown in FIG. 9. In this case, the rod-shaped power-feeding line member 102 is pressed by a resilient member 138 such as a coil spring, a leaf spring, a volute spring or the like, thereby assuring stable electric connection between the power-feeding line member 102 and the connection terminal 110.

In the fifth embodiment, there is provided the same advantageous effect as in the fourth embodiment. For example, it is possible to prevent occurrence of the thermal diffusion of metal elements in the joint portion between the connection terminal 110 and the power-feeding connector portion 114. Even if the thermal diffusion occurs, it does not affect the electric connection made by mechanical contact. In addition, omission of joint with a brazing material or the like makes it possible to relax the thermal stress created by the difference in linear expansion coefficient between the connection terminal 110 and the power-feeding connector portion 114.

<Sixth Embodiment>

Figure 10:
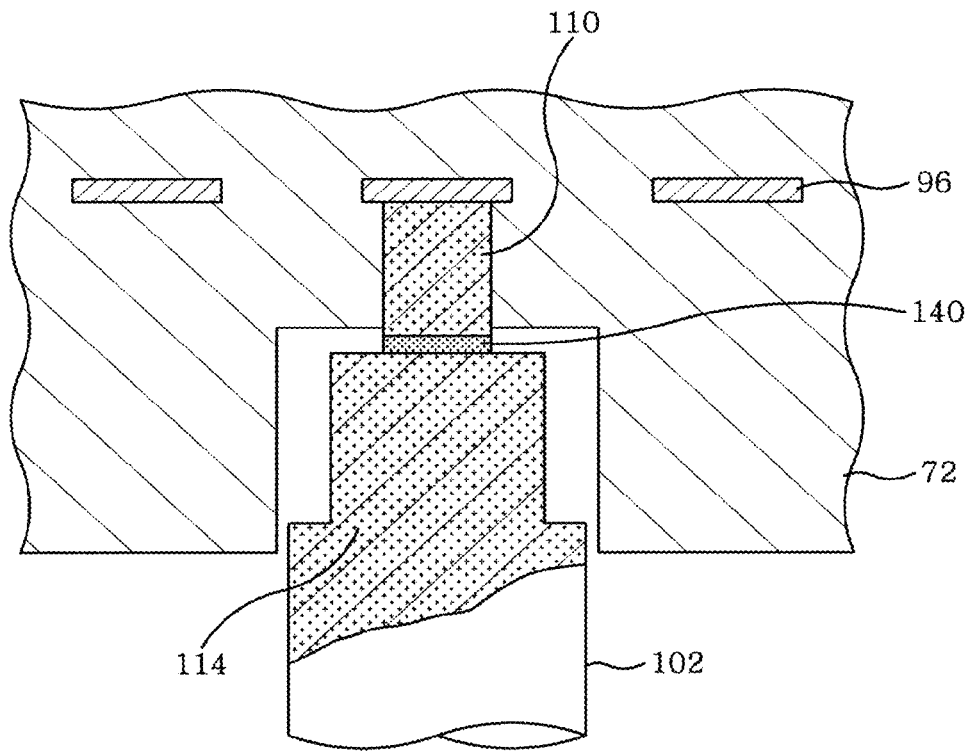
FIG. 10 is an enlarged cross sectional view showing major parts of a sixth embodiment of the mounting table structure in accordance with the present invention.

Next, description will be made on a sixth embodiment of the mounting table structure in accordance with the present invention. FIG. 10 is an enlarged cross sectional view showing major parts of a sixth embodiment of the mounting table structure in accordance with the present invention. The same component parts as those illustrated in FIGS. 2 through 9 are designated by like reference numerals in FIG. 10 and will be omitted from description. In the sixth embodiment, the stress relaxing member 116 is not employed as is the case in the fourth and fifth embodiments. The connection terminal 110 and the power-feeding connector portion 114 are directly jointed together. More specifically, the connection terminal 110 and the power-feeding connector portion 114 are all composed of an intermetallic compound with conductivity and oxidation resistance and are directly jointed together by, e.g., electric welding (spot welding), with no use of a brazing material. A welding portion 140 is formed in the boundary area. In this regard, $MoSi_2$ or Maxthal described above in connection with the third embodiment can be used as the intermetallic compound.

In this case, the rod-shaped power-feeding line member 102 may be made of the intermetallic compound in its entirety. However, $MoSi_2$ or Maxthal is expensive and relatively low in toughness, only the tip end portion of the rod-shaped power-feeding line member 102 (including the power-feeding connector portion 114) may be made of the intermetallic compound. The remaining portion may be made of a corrosion-resistant metal such as Ni or the like.

As stated above, the connection terminal 110 and the power-feeding connector portion 114 are made of the intermetallic compound with conductivity and oxidation resistance, and are jointed together by welding. Therefore, it is possible to prevent joint strength reduction in the joint portion between the connection terminal 110 and the power-feeding connector portion 114, which would otherwise be caused by the thermal diffusion of metal elements, especially cobalt and nickel.

<Seventh Embodiment>

Figure 11:
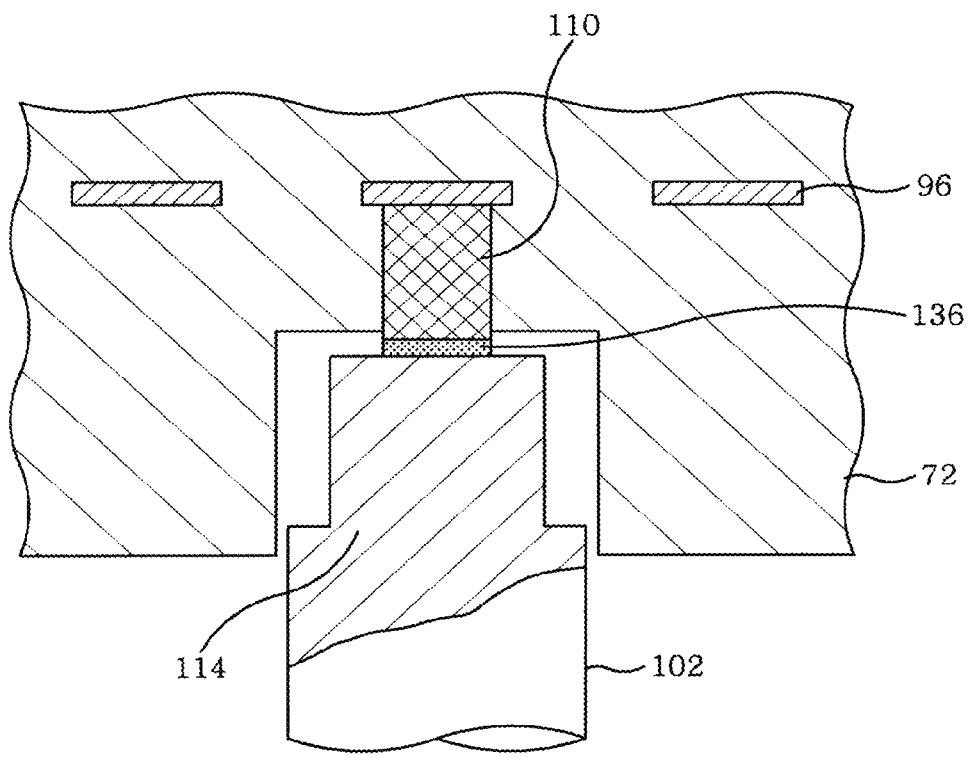
FIG. 11 is an enlarged cross sectional view showing major parts of a seventh embodiment of the mounting table structure in accordance with the present invention.

Next, description will be made on a seventh embodiment of the mounting table structure in accordance with the present invention. FIG. 11 is an enlarged cross sectional view showing major parts of a seventh embodiment of the mounting table structure in accordance with the present invention. The same component parts as those illustrated in FIGS. 2 through 10 are designated by like reference numerals in FIG. 11 and will be omitted from description. As in the fourth through sixth embodiments described above, the stress relaxing member 116 is not employed in the seventh embodiment. An intermetallic compound with conductivity and oxidation resistance is used as the connection terminal 110. In other words, the mounting table structure of this embodiment is the same as that of the third embodiment shown in FIG. 7 except for omission of the stress relaxing member 116.

More specifically, as shown in FIG. 11, an intermetallic compound is used as the connection terminal 110, and the connection terminal 110 and the power-feeding connector portion 114 are jointed together by a brazing material 136. In this regard, the brazing material 136 contains at least one of Ni, Pd, Ag and Ti. It is possible to use, as the intermetallic compound, the material described above in connection with the third embodiment shown in FIG. 7 and the sixth embodiment shown in FIG. 10, i.e., $MoSi_2$ or Maxthal. In this case, the power-feeding connector portion 114 may be made of Ni as in the conventional mounting table structure or an intermetallic compound.

As set forth above, the connection terminal 110 is made of the intermetallic compound with conductivity and oxidation resistance, and the connection terminal 110 and the power-feeding connector portion 114 are jointed together by the brazing material 136. Therefore, it is possible to prevent joint strength reduction in the joint portion between the connection terminal 110 and the power-feeding connector portion 114, which would otherwise be caused by the thermal diffusion of metal elements, especially cobalt and nickel.

<Eighth Embodiment>

Figure 12:
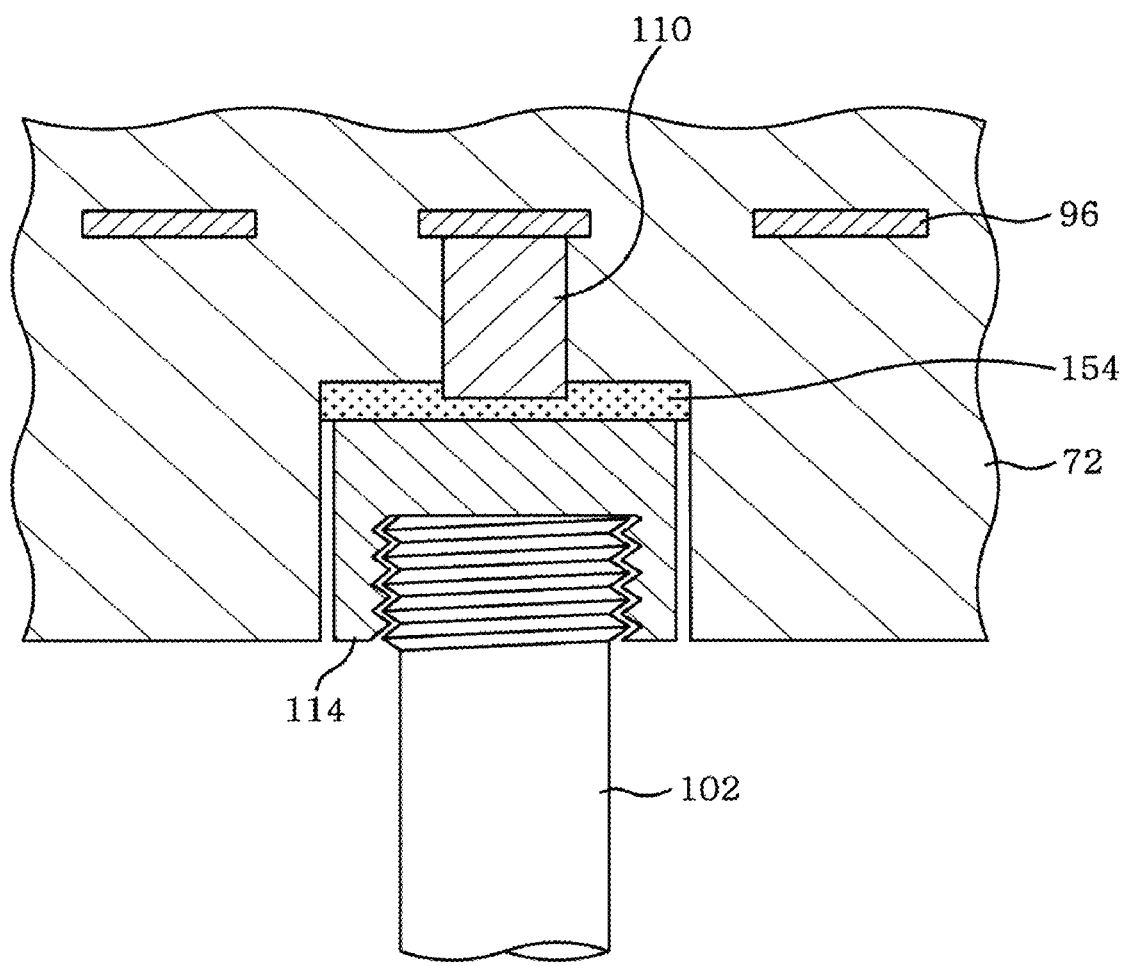
FIG. 12 is an enlarged cross sectional view showing major parts of an eighth embodiment of the mounting table structure in accordance with the present invention.
Figure 13:
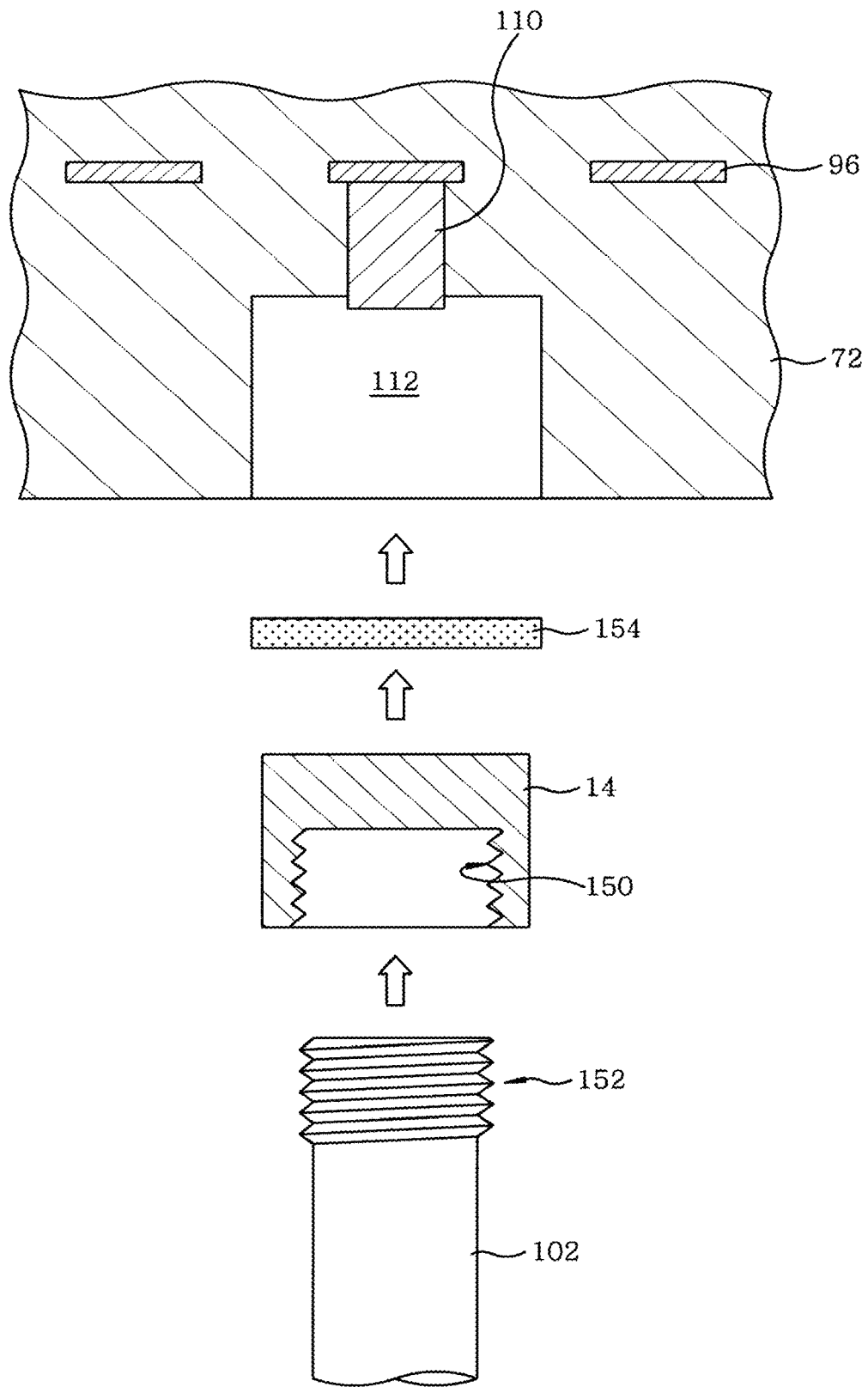
FIG. 13 is a partially enlarged cross sectional view showing an exploded state of the mounting table structure of the eighth embodiment.
Figure 14:
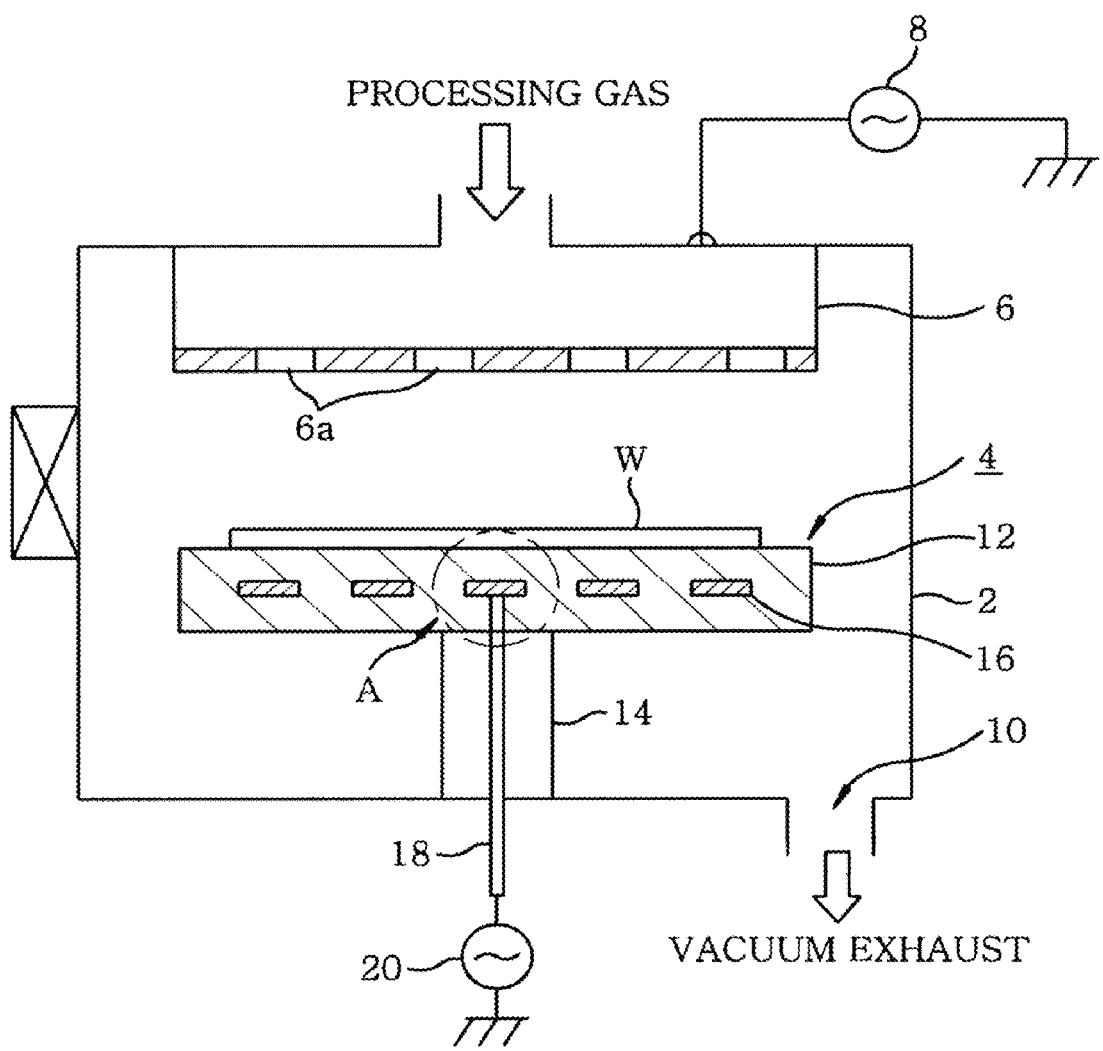
FIG. 14 is a schematic configuration view showing a conventionally available typical plasma processing apparatus.

Next, description will be made on an eighth embodiment of the mounting table structure in accordance with the present invention. FIG. 12 is an enlarged cross sectional view showing major parts of an eighth embodiment of the mounting table structure in accordance with the present invention. FIG. 13 is a partially enlarged cross sectional view showing an exploded state of the mounting table structure of the eighth embodiment.

The stress relaxing member is not employed in the eighth embodiment. The connection terminal and the power-feeding connector portion are made of a high-melting-point metal and jointed together by a brazing material. More specifically, as shown in FIGS. 12 and 13, a high-melting-point metal is used as the material of both the connection terminal 110 and the power-feeding connector portion 114 in this embodiment. A female thread 150 is formed in the power-feeding connector portion 114, and a male thread 152 corresponding to the female thread 150 is formed in the upper end portion of the power-feeding line member 102. The power-feeding connector portion 114 and the power-feeding line member 102 are connected to each other by threadedly coupling them. The upper end portion of the power-feeding connector portion 114 and the connection terminal 110 are jointed together by a brazing material 154.

In this case, it is preferable to use, as the brazing material 154, a material selected from the group consisting of an Au brazing material composed of Au (gold) and an Ag—Ti brazing material composed of Ag (silver) and Ti (titanium). In this regard, the Au brazing material is composed of about 100% of Au. The Ag—Ti brazing material contains about 10 wt % of Ti which serves as an activating agent.

In this connection, it is most preferable to use a pure-Au brazing material in order to prevent the thermal diffusion of metal atoms. In case the Au brazing material is employed as mentioned below, there is no need to use Ni which would be a cause of diffusion. This makes it possible to increase tensile strength and to reduce Vickers hardness, thereby making brittleness smaller.

In order to assemble the mounting table structure, the female thread 150 of the power-feeding connector portion 114 and the male thread 152 of the power-feeding line member 102 are threadedly coupled together to interconnect the power-feeding connector portion 114 and the power-feeding line member 102. Thereafter, the power-feeding connector portion 114 and the connection terminal 110 are jointed together by the brazing material 154. Alternatively, after jointing the power-feeding connector portion 114 and the connection terminal 110 by the brazing material 154, the male thread 152 of the power-feeding line member 102 may be threadedly coupled to the female thread 150 of the power-feeding connector portion 114 to interconnect the power-feeding connector portion 114 and the power-feeding line member 102.

In this embodiment, the joint portion between the connection terminal and the power-feeding connector portion is formed into a simple structure with no use of Fe, Ni, Co or other thermally diffusible metal elements. This makes it possible to restrain creation of brittle intermetallic compounds and to keep joint strength high. Although Mo is used as the high-melting-point metal in this embodiment, the present invention is not limited thereto. It may be possible to use one or more materials selected from the group consisting of molybdenum (Mo), a molybdenum alloy (a Mo alloy), tungsten (W) and a tungsten alloy (a W alloy).

As described above, the connection terminal 110 and the power-feeding connector portion 114 are all made of a high-melting-point metal and are jointed together by the brazing material 154. This makes it possible to prevent occurrence of the thermal diffusion of metal elements in the joint portion between the connection terminal 110 and the power-feeding connector portion 114, while avoiding deterioration in joint strength. The joint structure set forth above is equally employed in the other power-feeding line members 98 and 100.

Next, description will be made on the results of tests of Vickers hardness and tensile strength for the joint portions of the mounting table structures according to the embodiments of the present invention and for the joint portion of the conventional mounting table structure. As Examples of the present invention, joint structures just like the structure shown in FIG. 12 were produced in which Mo is used as the material of both the connection terminal 110 and the power-feeding connector portion 114 and in which two kinds of brazing materials, i.e., an Au brazing material (composed of pure Au) and an Ag—Ti brazing material (containing 10 wt % of Ti), are used as the brazing material 154. As a Comparative Example, a joint structure just like the conventional structure shown in FIG. 15 was produced in which the Kovar-made stress relaxing member 28 is interposed between the Ni-made power-feeding connector portion 26 and the Mo-made connection terminal 22 and jointed by the brazing materials 30 and 32.

In case of the conventional mounting table structure, the joint portion was 700 to 800 [Hv] in Vickers hardness, which means that the joint portion is very hard and brittle. In case of the mounting table structures according to the embodiments of the present invention, the joint portions exhibited Vickers hardness of 66 [Hv] when the Au brazing material is used and 578 [Hv] when the Ag—Ti brazing material is used. It was possible to note that, in all cases, the joint portions of the present mounting table structures are smaller in Vickers hardness and brittleness than the joint portion of the conventional mounting table structure. In particular, it was possible to see that, in case of using the Au brazing material, the Vickers hardness of the joint portions of the present mounting table structures is equal to or smaller than ⅒ of that of the joint portion of the conventional mounting table structure. This means that it is possible to greatly reduce the brittleness.

In case of the conventional mounting table structure, the tensile breaking load of the joint portion was equal to 100 [kgf]. In case of the mounting table structures according to the embodiments of the present invention, the tensile breaking load was 200 to 250 [kgf] when the Au brazing material is used and 140 [kgf] when the Ag—Ti brazing material is used. It was possible to note that the tensile strength can be increased in all cases. In particular, it was possible to see that, in case of using the Au brazing material, the tensile strength of the joint portions of the present mounting table structures is twice or more as great as that of the joint portion of the conventional mounting table structure.

As mentioned earlier, the joint structures described above in connection with the first through eighth embodiments are equally applicable to the upper end connector portions of the other power-feeding line members 98 and 100. Although the guide member 118 is not employed in the fourth through seventh embodiments, it goes without saying that the guide member 118 may be employed therein.

When the brazing materials 120, 122, 124 and 136 are used as in the first through eighth embodiments, a metal film made of the same material as the brazing materials may be formed on the surfaces of the respective members jointed by the brazing materials in advance, i.e., on the respective surfaces of the connection terminal 110, the power-feeding connector portion 114 and the stress relaxing member 116. The metal film may be formed by plating, sputtering, CVD film-forming or other methods. The reason for forming the metal film in advance is as follows. The brazing materials used at a high temperature may well be high in melting point and shows reduced flowability in the blazing process. Therefore, a hole is likely to occur in the blazed portions.

Some of the brazing materials free from the elements becoming a cause of brittleness, which is one of the features of the present invention, are lower in flowability than the conventional brazing material. If the metal film made of the same material as the brazing materials is formed on the surface of one or both of the brazed members by, e.g., plating or the like in advance, it becomes possible to ideally improve the wettability of the brazing materials. Such improvement of the wettability ensures that a brazing material with reduced flowability can easily infiltrate into a narrow space, thus restraining creation of the hole mentioned above. In addition, if the metal film is formed on the two surfaces of the blazed members, it becomes possible to perform diffusion joint by reducing the joint temperature.

Although the electrode for the electrostatic chuck serves as the lower electrode for supplying high-frequency waves in the foregoing embodiments, the electrode for the electrostatic chuck and the lower electrode may be formed of separate members. Furthermore, although the plasma processing apparatus is a parallel-plate type plasma processing apparatus in the foregoing embodiments, the present invention is not limited thereto. The plasma processing apparatus may be an arbitrary type of plasma processing apparatus operable with high-frequency power or microwave power.

The mounting table structure in accordance with the present invention may apply to non-plasma type processing apparatuses, e.g., a thermal CVD film-forming apparatus, a thermal oxidation apparatus, an annealing apparatus and a reforming apparatus. In this case, there is no need to provide the electrostatic chuck and the lower electrode. Although a semiconductor wafer is used as a target object in the foregoing embodiments, the target object is not limited to the semiconductor wafer but may be other kinds of substrates such as a glass substrate, an LCD substrate, a ceramic substrate and the like.

What is claimed is:

1. A mounting table structure comprising:
   a mounting table body made of ceramic, the mounting table body including a power-receiving conductor portion buried therein, a surface formed with a recessed connection hole and a connection terminal electrically jointed to the power-receiving conductor portion and exposed in the connection hole;
   a power-feeding line member provided with a power-feeding connector portion, a leading end of the power-feeding line member being inserted into the connection hole to feed electricity to the power-receiving conductor portion; and
   a support column for supporting the mounting table body, wherein the power-feeding line member passes through an internal space of the support column,
   wherein each of the connection terminal and the power-feeding connector portion is made of a metal or a metal alloy, and the connection terminal and the power-feeding connector portion are jointed together by a brazing material, consisting of an Au
   wherein the power-feeding connector portion and the power-feeding line member are connected to each other by thread coupling,
   wherein a female thread is formed in the power-feeding connector portion, and a male thread corresponding to the female thread is formed in an upper end portion of the power-feeding line member,
   wherein each of the connection terminal and the power-feeding connector is made of one or more materials selected from the group consisting of molybdenum (Mo), a molybdenum alloy, tungsten (W) and a tungsten alloy,
   wherein the brazing material is formed on the entire surface of an inner end of the connection hole such that the brazing material is in contact with a sidewall of the connection hole,
   wherein a width of the power-feeding connector portion is greater than a width of the connection terminal and a diameter of the power-feeding connector portion is smaller than that of the connection hole, and
   wherein a space surrounded by the sidewall of the connection hole, a sidewall of the power-feeding connector portion and the brazing material formed on the inner end of the connection hole exists in the connection hole.

2. The mounting table structure of claim 1, wherein the power-receiving conductor portion includes a heater portion serving as a heat-generating body.

3. The mounting table structure of claim 1, wherein the power-receiving conductor portion includes a chuck electrode for an electrostatic chuck.

4. The mounting table structure of claim 1, wherein the power-receiving conductor portion includes an electrode supplied with high-frequency power.

5. The mounting table structure of claim 1, wherein a metal film made of the same material as the brazing material is formed in advance on a surface of each of the connection terminal and the power-feeding connector portion before the connection terminal and the power-feeding connector portion are jointed by the brazing material.

6. A processing apparatus for processing a target object, comprising:
   a vacuum evacutable processing chamber;
   the mounting table structure of claim 1 provided within the processing chamber for holding the target object; and
   a gas introduction unit for introducing a gas into the processing chamber.

7. The processing apparatus of claim 6, further comprising an inert gas supply unit which supplies an inert gas into the mounting table structure through the internal space of the support column.

* * * * *